(12) United States Patent
Kim

(10) Patent No.: US 8,928,016 B2
(45) Date of Patent: Jan. 6, 2015

(54) LIGHT EMITTING DEVICE, LIGHT EMITTING DEVICE PACKAGE, AND LIGHT SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 501 days.

(21) Appl. No.: 12/900,102

(22) Filed: Oct. 7, 2010

(65) Prior Publication Data

US 2011/0186883 A1    Aug. 4, 2011

(30) Foreign Application Priority Data

Feb. 1, 2010    (KR) .................. 10-2010-0009212

(51) Int. Cl.
*H01L 33/30*    (2010.01)
*H01L 33/48*    (2010.01)
*H01L 33/20*    (2010.01)

(52) U.S. Cl.
CPC ......... *H01L 33/20* (2013.01); *H01L 2933/0083* (2013.01)
USPC .................. 257/96; 257/13; 257/19; 257/79; 257/95; 257/98; 257/99; 257/E25.028; 257/E25.032; 257/E33.04; 257/E33.058; 257/E33.068

(58) Field of Classification Search
USPC ........ 257/13, 19, 79, 95, 96, 98, 99, E25.028, 257/E25.032, E33.049, E33.058, E33.068
See application file for complete search history.

(56) References Cited

U.S. PATENT DOCUMENTS

| | | | |
|---|---|---|---|
| 5,896,119 A | 4/1999 | Evanicky et al. | |
| 7,102,175 B2 * | 9/2006 | Orita | ................................ 257/97 |
| 7,306,960 B2 | 12/2007 | Bogner et al. | |
| 7,683,539 B2 | 3/2010 | Kim et al. | |
| 2007/0257269 A1 * | 11/2007 | Cho et al. | .......................... 257/95 |
| 2007/0295981 A1 | 12/2007 | Erchak | |
| 2010/0295014 A1 | 11/2010 | Kang | |
| 2013/0001625 A1 | 1/2013 | Cho et al. | |

FOREIGN PATENT DOCUMENTS

| | | |
|---|---|---|
| CN | 1437770 A | 8/2003 |
| CN | 1866561 A | 11/2006 |
| CN | 101071840 A | 11/2007 |
| CN | 101571246 A | 11/2009 |
| KR | 2007-0117336 | 12/2007 |
| KR | 20090074359 | 7/2009 |
| WO | 2008020819 A1 | 2/2008 |
| WO | WO 2009/028860 A2 | 3/2009 |
| WO | WO 2009/032813 A2 | 3/2009 |

* cited by examiner

*Primary Examiner* — Matthew W Such
*Assistant Examiner* — David Spalla
(74) *Attorney, Agent, or Firm* — McKenna Long & Aldridge LLP

(57) ABSTRACT

A light emitting device includes a light emitting structure including a first conductive type semiconductor layer, a second conductive type semiconductor layer, and an active layer between the first conductive type semiconductor layer and the second conductive type semiconductor layer, and a light extraction structure that extracts light from the light emitting structure. The light extraction structure includes at least a first light extraction zone and a second light extraction zone, where a period and/or size of first concave and/or convex structures of the first light extraction zone is different from a period and/or size of second concave and/or convex structures of the second light extraction zone.

26 Claims, 7 Drawing Sheets

LIGHT EMITTING DEVICE, LIGHT EMITTING DEVICE PACKAGE, AND LIGHT SYSTEM

This application claims under 35 U.S.C. §119 to Korean Patent Application No. 10-2010-0009212 filed Feb. 1, 2010, which is hereby incorporated by reference in its entirety.

BACKGROUND

The present disclosure relates to a light emitting device, a light emitting device package, and a lighting system.

A light emitting device (LED) includes a p-n junction diode, whose characteristic includes converting electric energy into light energy and which may be manufactured by combining Group III and Group V elements in the periodic table. The LED may display a variety of colors by adjusting the composition ratio of a compound semiconductor.

The LED emits energy that corresponds to an energy gap between a conduction band and a valance band, which occurs after electrons of an n-layer and holes of a p-layer are combined during application of forward voltage. This energy is typically emitted in a form of heat or light and if emitted in a form of light, it becomes a LED.

For example, since a nitride semiconductor has a high thermal stability and wide band-gap energy, it receives a lot of attention in optical device and high-output electronic device development fields. Especially, a blue LED, a green LED, and an UV LED, which use a nitride semiconductor, are commercialized and extensively used.

However, in relation to the related art, even when a light extraction structure is introduced in order to improve light extraction efficiency of the LED, the light extraction efficiency does not reach a preferred value.

SUMMARY

Embodiments provide a light emitting device, a light emitting device package, and a lighting system, having high light extraction efficiency.

In one embodiment, a light emitting device comprises a light emitting structure including a first conductive type semiconductor layer, a second conductive type semiconductor layer, and an active layer between the first conductive type semiconductor layer and the second conductive type semiconductor layer; and a light extraction structure including at least a first light extraction zone and a second light extraction zone, wherein a period and/or size of first concave and/or convex structures of the first light extraction zone is different from a period and/or size of second concave and/or convex structures of the second light extraction zone.

In another embodiment, a light emitting device comprises a light emitting structure including a first conductive type semiconductor layer, a second conductive type semiconductor layer, and an active layer between the first conductive type semiconductor layer and the second conductive type semiconductor layer; and a light extraction structure including at least a first light extraction zone and a second light extraction zone, wherein a period and/or size of first protrusion and/or recess structures of the first light extraction zone is different from a period and/or size of second protrusion and/or recess structures of the second light extraction zone.

In another embodiment, a light emitting device package comprises a package body; at least one electrode layer installed at the package body; and a light emitting device connected to the electrode layer electrically.

In further another embodiment, a lighting system comprises a substrate; and a light emitting module including a substrate and a light emitting device package installed on the substrate, wherein the light emitting device package includes a package body; at least one electrode layer installed at the package body; and a light emitting device connected to the electrode layer electrically.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Hereinafter, a light emitting device, a light emitting device package, and a lighting system are described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1A:
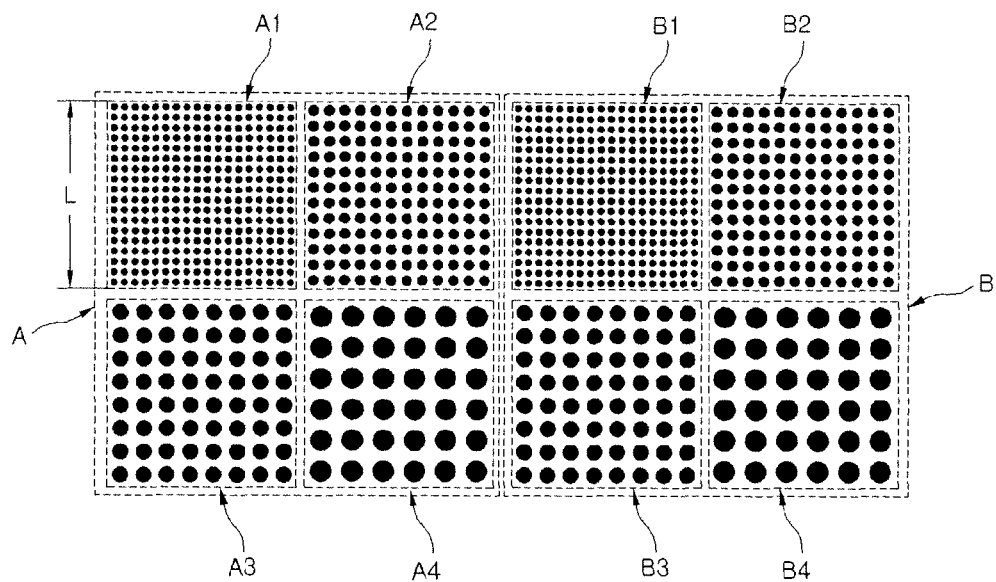
FIG. 1a is a plan view of a light emitting device according to a first embodiment.
Figure 1B:
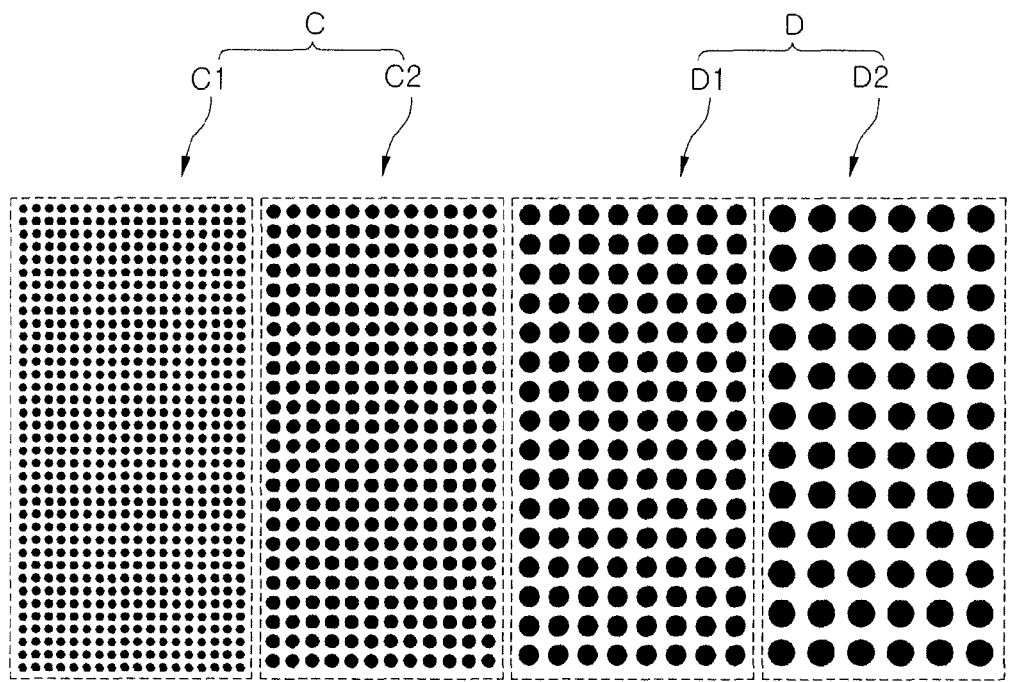
FIG. 1b is a plan view of a light emitting device according to a second embodiment.
Figure 2:
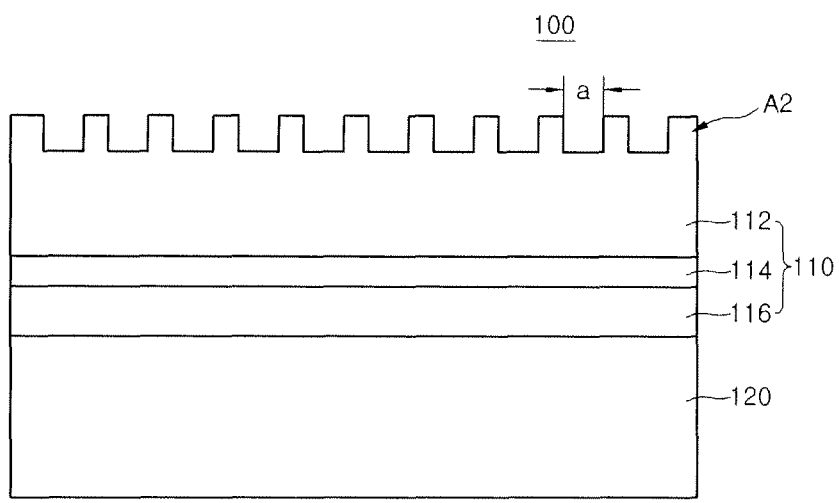
FIG. 2 is a partial sectional view of a light emitting device according to an embodiment.

FIG. 1a is a plan view of a light emitting device according to a first embodiment and FIG. 2 is a partial sectional view of a light emitting device according to an embodiment. For example, FIG. 2 is a partial sectional view about a second light extraction zone A2 of FIG. 1.

The light emitting device may include a light emitting structure 110 (that includes a first conductive type semiconductor layer 112, an active layer 114, and a second conductive type semiconductor layer 116) and a light extraction zone A (that is on the light emitting structure 110 and has respectively different periods).

In this embodiment, the light extraction zone may include at least one light crystal zone, but is not limited thereto.

The light extraction zone A may include a first light extraction zone A1 with a first period on the light emitting structure 110 and a second light extraction zone A2 with a second period on one side of the first light extraction zone, but is not limited thereto. A period in a light extraction zone may be formed using a sub-light extraction structure having a concave shape, a convex shape, or a combination thereof. For example, the sub-light extraction structures may be etched or grown on the light extraction structure. In another embodiment, the period in a light extraction zone may be formed using a sub-light extraction structure that is a protrusion, a recess, or a combination thereof. While a period between two sub-light extraction structures are used in this embodiment with the sub-light structures having a same or similar size, in another embodiment, the size of the sub-light structures can be varied in different light extraction zones to achieve the same or similar effects as varying the period in different light extraction zones.

According to this embodiment, the light extraction zone A may include a third light extraction zone A3 with a third period and a fourth light extraction zone A4 with a fourth period. The first, second, third, and fourth light extraction zones may be arranged in a matrix.

The light extraction zone A may be divided by a line form region. For example, the light extraction zone A may include a line-shaped region interposed between the first light extraction zone A1 and the second light extraction zone A2, but is not limited thereto.

The length L of the first light extraction zone A1 or the second light extraction zone A2 may be between about 5 μm to about 200 μm but is not limited thereto.

The length of the first light extraction zone A1 or the second light extraction zone A2 may be smaller as absorption of the light emitting structure 110 is higher.

A period a of light extraction in the light extraction zone A may be between about 200 nm to about 5000 nm but is not limited thereto. Moreover, difference between each light extraction period may be more than about 100 nm in the light extraction zone A, but is not limited thereto.

This embodiment may include a light extraction zone where at least two light extraction zones constitute one group.

For example, the first light extraction zone A1 and the second light extraction zone A2 may constitute a first extraction zone A of a first group.

Moreover, according to the embodiment, light extraction zones constituting the group may be repeatedly formed to fill a light emitting device chip. For example, a light extraction zone B of a second group may be formed at one side of the light extraction zone A of the first group, and the light extraction zone B of the second group may include at least two light extraction zones having respectively different periods. For example, the light extraction zone B of the second group may include first to fourth light extraction zones B1, B2, B3, and B4. A light-shaped region may be interposed between the light extraction zone A of the first group and the light extraction zone B of the second group.

FIG. 1b is a plan view of a light emitting device according to a second embodiment.

In the second embodiment, the light extraction zone may include at least one line-shaped pattern.

The second embodiment may include a light extraction zone where at least two light extraction zones are arranged linearly and constitute one group.

For example, a line-shaped first light extraction zone C1 and a line-shaped second light extraction zone C2 may constitute a extraction zone C of a third group.

Moreover, according to the second embodiment, light extraction zones constituting the group may be repeatedly formed to fill a light emitting device chip. For example, a light extraction zone D of a fourth group may be formed at one side of the light extraction zone C of the third group, and the light extraction zone D of the fourth group may include at least two light extraction zones having respectively different periods. For example, the light extraction zone D of the fourth group may include first to second light extraction zones D1 and D2.

A light-shaped region may be interposed between the light extraction zone C of the third group and the light extraction zone D of the fourth group.

Figure 3:
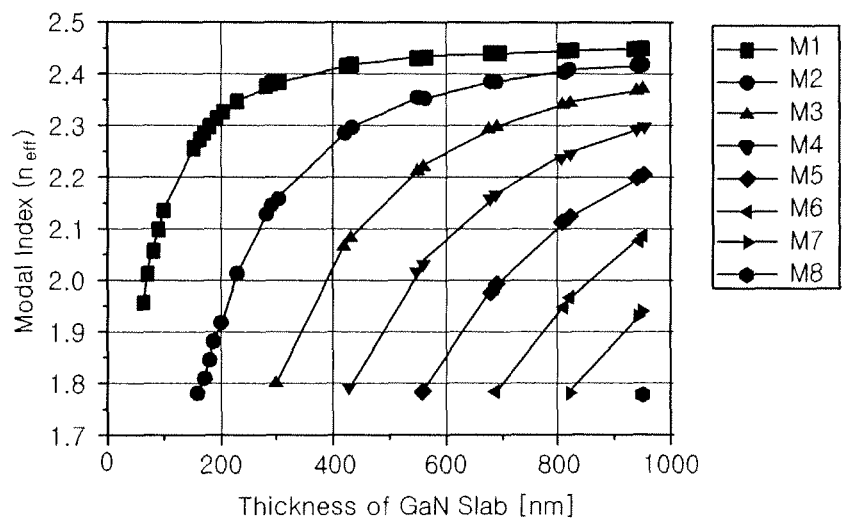
FIG. 3 is a graph of an effective refractive index according to a thickness of a light emitting structure of a light emitting device according to an embodiment.

FIG. 3 is a graph of an effective refractive index according to a thickness of a light emitting structure of a light emitting device according to an embodiment.

In order to realize a highly efficient LED, it is necessary to introduce a structure for extracting light trapped during total reflection. For example, in case of a vertical GaN LED, an uneven or light extraction pattern may be introduced on a light emitting structure corresponding to the top layer portion such as an un-doped semiconductor layer (u-GaN) or n-GaN surface. However, any layer may be used that can extract trapped light due to reflection within the layers of the light emitting device.

Furthermore, a typical LED structure has a structure where a light emitting structure as a light generating layer is surrounded by a reflective layer and a background material of a low refractive index, and thus may be regarded as waveguide. Also, propagation modes of various orders may exist. Here, a period that effectively extracts each propagation mode may vary. Therefore, it is difficult in principle to reach an ideal extraction efficiency value through a light extraction pattern of a single period.

For example, FIG. 3 is a graph illustrating a relation between the number of propagation modes and a refractive index according to a thickness of a light emitting structure, where the number of propagation modes is continuously increased as the thickness of a light emitting structure is increased. Accordingly, it is difficult in principle to reach an ideal extraction efficiency value through a light extraction pattern of a single period.

In the light emitting device according to the embodiment, a plurality of patterns having respectively different periods of a light extraction structure are divided by each zone and the length of each zone may be determined by the effective propagation distance of a propagation mode. Accordingly, according to the embodiment, patterns having respectively different periods may diffract respectively different propagation modes such that light extraction efficiency can be improved.

For example, in relation to a light extraction zone of the light emitting device according to the embodiment, light extraction structures having respectively different periods may be divided by each zone. Since a propagation mode for effective extraction at each period is determined, if it meets a optimal light extraction zone before a corresponding propagation mode disappears due to absorption, extraction efficiency can be improved. Here, the length of each zone is related to an effective propagation distance of each propagation mode and this is determined by the absorption of a material.

Figure 4:
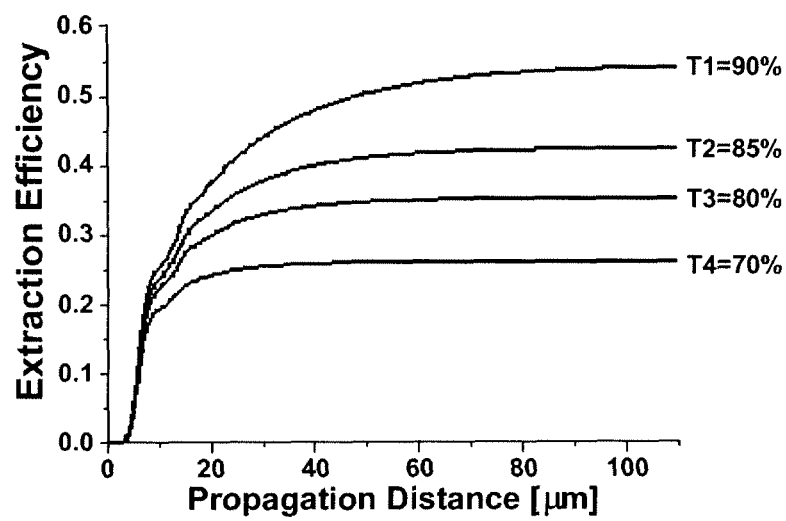
FIG. 4 is a graph of extraction efficiency according to a propagation distance of light of the light emitting device according to an embodiment.

FIG. 4 is a graph of extraction efficiency according to a propagation distance of light of the light emitting device according to an embodiment.

If an absorption coefficient of light is α, transmittance is defined as follows. $T=T_o \times \exp(-\alpha \times l)$ (here, l is propagation distance)

Furthermore, a relation between the absorption coefficient α and extinction coefficient κ is as follows. $\alpha = 4\pi\kappa/\lambda$.

According to the embodiment, the first conductive type semiconductor layer 112 as an absorption layer is introduced around the active layer 114 as a light emitting layer, and if light extraction efficiency by a light extraction pattern is calculated, it is shown in FIG. 4.

Referring to FIG. 4, it is shown that extraction efficiency is changed according to transmittances T1, T2, T3, and T4 of the first conductive type semiconductor layer as an absorption layer. That is, as the absorption layer is more transparent, absorption is lower, resulting in the increase of extraction efficiency and as light loss becomes greater due to absorption of the absorption layer, extraction efficiency becomes deteriorated.

If considering the increase trend of extraction efficiency based on a propagation distance of light, the effective distance is affected by the degree of absorption. For example, if transmittance of the absorption layer is 70% (T4), the effective distance of light is about 20 μm and if transmittance is 90% (T1), the effective distance is about 100 μm. If considering that current LED's extraction efficiency has a value between about 20% to about 80%, the effective distance of light may be between about 5 μm and about 200 μm, but is not limited thereto. Accordingly, since the effective propagation distance of GaN LED is between about 5 μm and about 200 μm, the length L of each light extraction zone may be similarly configured.

In relation to the light extraction zones of the light emitting device, a plurality of light extraction structures having respectively different periods are divided by each zone and the length of each zone may be determined by the effective propagation distance of a propagation mode. Accordingly, based on the embodiment, patterns having respectively different periods may diffract respectively different propagation modes such that light extraction efficiency can be improved.

Hereinafter, referring to FIGS. 5 through 7, a method of manufacturing a light emitting device according to an embodiment will be described.

Figure 5:
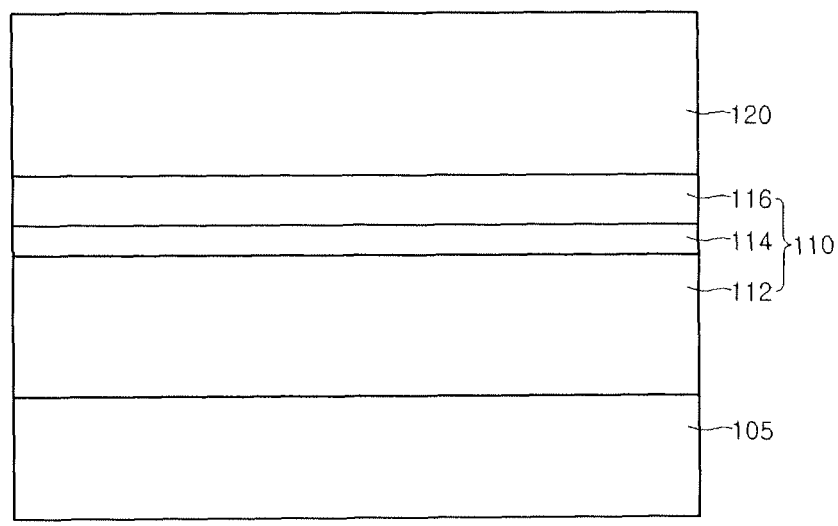
FIGS. 5 through 7 are views illustrating a method of manufacturing a light emitting device according to an embodiment.

First, as shown in FIG. 5, a first substrate 105 is prepared. The first substrate 105 includes a conductive substrate or an insulation substrate and for example, the first substrate 105 may be formed of at least one of $Al_2O_3$, SiC, Si, GaAs, GaN, ZnO, Si, GaP, InP, Ge, and $Ga_2O_3$. An uneven structure may be formed on the first substrate 105 but is not limited thereto. Foreign materials of the surface may be removed by wet-cleansing the first substrate 105.

Next, a light emitting structure 110 including a first conductive type semiconductor layer 112, an active layer 114, and a second conductive type semiconductor layer 116 may be formed on the first substrate 105.

The light emitting structure 110 may be formed using methods such as Metal Organic Chemical Vapor Deposition (MOCVD), Chemical Vapor Deposition (CVD), Plasma-Enhanced Chemical Vapor Deposition (PECVD), Molecular Beam Epitaxy ((MBE), and Hydride Vapor Phase Epitaxy (HVPE), but is not limited thereto.

A buffer layer (not shown) may be formed on the first substrate 105. The buffer layer may alleviate the lattice mismatch between the material of the light emitting structure 110 and the first substrate 105, and a material of the buffer layer may include at last one of III Group-V Group compound semiconductors such as GaN, InN, AlN, InGaN, AlGaN, InAlGaN, and AlInN. An un-doped semiconductor layer may be formed on the buffer layer but is not limited thereto.

The first conductive semiconductor layer 112 may be realized with III Group-V Group compound semiconductors into which a first conductive type dopant is doped, and if the first conductive type semiconductor layer 112 is an N-type semiconductor layer, the first conductive type dopant may include Si, Ge, Sn, Se, and Te as an N-type dopant, but is not limited thereto.

The first conductive type semiconductor layer 112 may include a semiconductor material having a composition equation of $In_xAl_yGa_{1-x-y}N$ ($0 \leq x \leq 1$, $0 \leq y \leq 1$, $0 \leq x+y \leq 1$).

The first conductive type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112 may form an N-type GaN layer using methods such as CVD, MBE, sputtering, or MVPE. Moreover, the first conductive type semiconductor layer 112 may be formed after injecting TMGa, $NH_3$, $N_2$, and $SiH_4$ including an n-type impurity such as Si in a chamber.

The active layer 114 emits light having an energy that is determined by a material-specific energy band of an active layer (a light emitting layer) after electrons implanted through the first conductive type semiconductor layer 112 and holes implanted through the second conductive type semiconductor layer 116 to be formed later are combined.

The active layer 114 may be formed with at least one of a single quantum well structure, a multi quantum well (MQW) structure, a quantum wire structure, or a quantum dot structure. For example, the active layer 114 may be formed with a MQW structure into which TMGa, $NH_3$, $N_2$, and TMIn are implanted, but is not limited thereto.

A well layer/barrier layer of the active layer 114 may be formed with a pair structure of at least one of InGaN/GaN, InGaN/InGaN, AlGaN/GaN, InAlGaN/GaN, GaAs/AlGaAs (InGaAs), and GaP/AlGaP(InGaP) but is not limited thereto. The well layer may be formed of a material having a lower band gap than the barrier layer.

A conductive type clad layer may be formed on or/and below the active layer 114. The conductive type clad layer may be formed of AlGaN based semiconductor, and may have a higher band gap than the active layer 114.

The second conductive type semiconductor layer 116 may have a compound semiconductor of III Group-V Group elements in to which a second conductive type dopant is doped such as a semiconductor material having a composition equation of $In_xAl_yGa_{1-x-y}N$ ($0 \leq x \leq 1$, $0 \leq y \leq 1$, $0 \leq x+y \leq 1$). The second conductive type semiconductor layer 116 may be selected from GaN, AlN, AlGaN, InGaN, InN, InAlGaN, AlInN, AlGaAs, GaP, GaAs, GaAsP, and AlGaInP. If the second conductive type semiconductor layer 116 is a P-type semiconductor layer, the second conductive type dopant may include Mg, Zn, Ca, Sr, and Ba as a P-type dopant. The second conductive type semiconductor layer 116 may be formed with single or multi-layers, but is not limited thereto.

The second conductive type semiconductor layer 116 is formed of a p-type GaN layer into which ($EtCp_2Mg$){$Mg (C_2H_5C_5H_4)_2$} including a p-type impurity such as TMGa, $NH_3$, $N_2$, and Mg is implanted but is not limited thereto.

In this embodiment, the first conductive type semiconductor layer 112 may be realized with an N-type semiconductor layer and the second conductive type semiconductor layer 116 may be formed of a P-type semiconductor layer, but they are not limited thereto. Furthermore, a semiconductor having an opposite polarity to the second conductive type such as an N-type semiconductor layer (not shown) may be formed on the second conductive type semiconductor layer 116. Accordingly, the light emitting structure 110 may be realized with one of an N—P junction structure, a P—N junction structure, an N—P—N junction structure, and a P—N—P junction structure.

Next, a second electrode layer 120 is formed on the second conductive semiconductor layer 116.

The second electrode layer 120 may include an ohmic layer (not shown), a reflective layer (not shown), a contact layer (not shown), and a support substrate (not shown).

For example, the second electrode layer 120 may include an ohmic layer (not shown) and the ohmic layer may ohmic contact the light emitting structure 110 to allow power to be smoothly supplied and may be formed by stacking a single metal or a metal alloy and a metal oxide in a multi-layered form.

For example, the ohmic layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf and is not limited thereto.

Moreover, the second electrode layer 120 may include a reflective layer (not shown) and reflects light incident from the light emitting structure 110 such that light extraction efficiency can be improved.

For example, the reflective layer may be formed of a metal or an alloy, which includes at least one of Ag, Ni, Al, Rh, Pd, Ir, Ru, Mg, Zn, Pt, Au, and Hf. Furthermore, the reflective layer (not shown) may be formed of the metal or the alloy and translucency conductive material such as IZO, IZTO, IAZO, IGZO, IGTO, AZO, and ATO in a multi layer form, and may be formed by stacking IZO/Ni, AZO/Ag, IZO/Ag/Ni, and AZO/Ag/Ni.

In addition, if the second electrode layer 120 includes a junction layer, the reflective layer (not shown) may serve as a junction layer, or may include a barrier metal or a bonding metal. For example, the junction layer may include at least one of Ti, Au, Sn, Ni, Cr, Ga, In, Bi, Cu, Ag or Ta.

In addition, the second electrode layer 120 may include a support substrate (not shown). The support substrate supports the light emitting structure 110 and may provide power to the light emitting structure 110. The support substrate (not shown) may be formed of a metal, a metal alloy, or a conductive semiconductor material of excellent electrical conductivity.

For example, the support substrate may include one of Cu, Cu alloy, Au, Ni, Mo, Cu—W, and a carrier wafer such as Si, Ge, GaAs, GaN, ZnO, SiGe, and SiC.

A thickness of the support substrate may vary according to a design of the light emitting device 100, but may have a range of about 30 µm to about 500 µm.

A method of forming the support substrate may include an electro-chemical metal deposition method, a plating method, and a bonding method using a eutectic metal.

Figure 6:
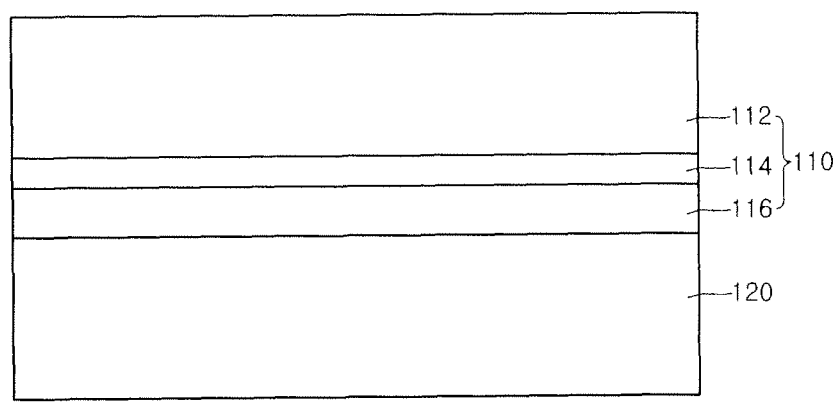

Next, as shown in FIG. 6, the first substrate 105 is removed to expose the first conductive type semiconductor layer 112. A method of removing the first substrate 105 may include a laser lift off method or a chemical lift off method. Additionally, the first substrate 105 may be removed with physical grinding.

For example, the laser lift off method may separate the first substrate 105 from the light emitting structure if a predetermined energy is applied to allow the interface between the first substrate 105 and the light emitting structure to absorb energy in order to pyrolyze the contact surface of the light emitting structure.

Figure 7:
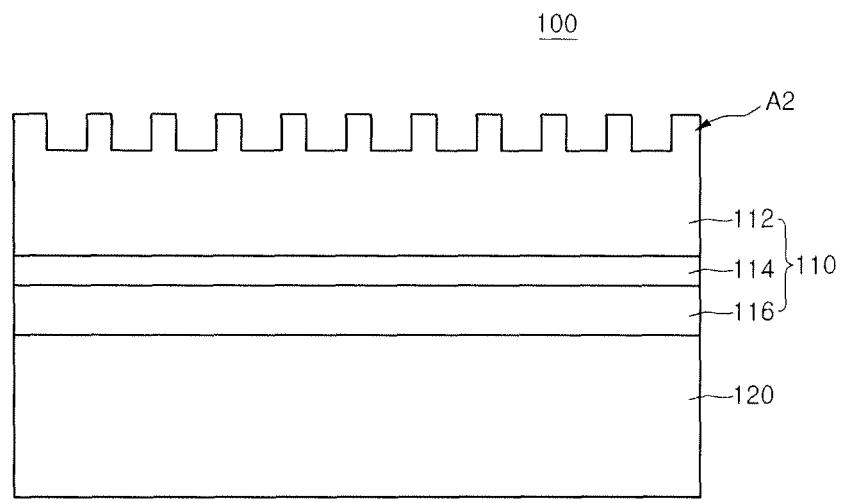

Next, as shown in FIG. 7, light extraction zones having respectively different periods are formed on the light emitting structure 110. FIG. 1 is a plan view of the light emitting device according to the embodiment.

The forming of the light extraction zones A having respectively different periods on the light emitting structure 110 may include forming a first light extraction zone A1 having a first period on the light emitting structure, and forming a second light extraction zone A2 having a second period at one side of the first light extraction zone A1.

Moreover, according to this embodiment, the light extraction zone A may include a third light extraction zone A3 having a third period and a fourth light extraction zone A4 having a fourth period.

The length L of the first light extraction zone A1 or the second light extraction zone A2 may be between about 5 µm and about 200 µm, but is not limited thereto.

The length L of the first light extraction zone A1 or the second light extraction zone A2 may be smaller as absorption of the light emitting structure 110 is higher.

A period a of light extraction in the light extraction zone A may be between about 200 nm and about 5000 nm, but is not limited thereto. Furthermore, a difference between each light extraction period in the light extraction zone A may be more than about 100 nm but is not limited thereto.

In relation to a light extraction zone of this embodiment, at least two light extraction zones may constitute a group. For example, the first light extraction zone A1 and the second light extraction zone A2 may constitute the light extraction zone A of the first group.

In addition, according to this embodiment, light extraction zones constituting the group may be repeatedly formed to fill a light emitting device chip. For example, the light extraction zone B of the second group may be formed at one side of the light extraction zone A of the first group, and the light extraction zone B of the second group may include at least two light extraction zones having respectively different periods. For example, the light extraction zone B of the second group may include first to fourth light extraction zones B1, B2, B3, and B4.

The light extraction zone A may be formed on the first conductive type semiconductor layer 112 of the light emitting structure 110 but is not limited thereto, and thus may be formed on an un-doped semiconductor layer.

A process for forming the light extraction zone A may be performed through wet etching or dry etching but is not limited thereto.

In this embodiment, the light extraction zone A of the first group may be formed by single process using one mask pattern, or the first light extraction zone A1 to the fourth light extraction zone A4 may be formed by a separate process using a separate mask.

In this embodiment, the light extraction pattern may have a circular form, a polygonal form, and so forth but is not limited thereto.

Moreover, according to this embodiment, the light extraction pattern is not limited to being arranged in a parallel form as shown in FIG. 1, and thus may be arranged in a lattice form.

Additionally, referring to FIG. 1, a light extraction pattern is disposed in order to allow a ratio of a radius (r)/a period a to have a predetermined value, for example, r/a=0.35, but is not limited thereto. The light extraction pattern may be disposed in order to have the same length but different periods.

According to the method of manufacturing a light emitting device, a plurality of light extraction patterns having respectively different periods are divided by each zone, and the length of each zone may be determined by the effective propagation distance of a propagation mode. Therefore, according to the embodiment, patterns having respectively different periods may diffract respectively different propagation modes such that light extraction efficiency can be improved.

Furthermore, unlike the embodiment, a light extraction structure including the light extraction zone may be formed on a horizontal light emitting device.

Moreover, the light extraction structure may be formed in the light emitting device.

Figure 8:
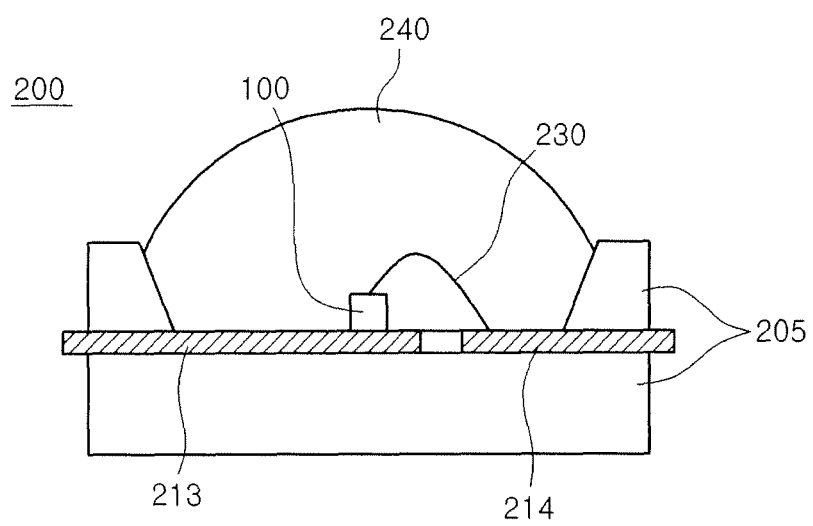
FIG. 8 is a view illustrating a light emitting device package where a light emitting device according to embodiments is installed.

FIG. 8 is a view illustrating a light emitting device package 200 where a light emitting device according to embodiments is installed.

Referring to FIG. 8, the light emitting device package 200 may include a package body 205, a third electrode layer 213 and a fourth electrode layer 214 installed at the package body 205, a light emitting device 100 installed at the package body 205 to be electrically connected to the third electrode layer 213 and the fourth electrode layer 214, and a molding member 240 surrounding the light emitting device 100.

The package body 205 may be formed of silicon material, synthetic resin, or metal material, and an inclined plane may be formed around the light emitting device 100.

The third electrode layer 213 and the fourth electrode layer 214 are electrically separated from each other and serve to provide power to the light emitting device 100. Moreover, the third electrode layer 213 and the fourth electrode layer 214 reflect light generated from the light emitting device 100 to improve light efficiency and discharge heat generated from the light emitting device 100 to the outside.

The vertical type light emitting device of FIG. 1 may be applied to the light emitting device 100 but is not limited thereto, and thus a horizontal type light emitting device may also be applied thereto.

The light emitting device 100 may be installed on the package body 205 or may be installed on the third electrode layer 213 or the fourth electrode layer 214.

The light emitting device 100 may be electrically connected to the third electrode layer 213 and/or the fourth electrode layer 214 through a wiring method, a flip chip method, or a die bonding method. In this embodiment, it is shown that the light emitting device 100 is electrically connected to the fourth electrode layer 214 through a wire 230 and directly contacts the third electrode layer 213 to have electrical connection.

The molding member 240 surrounds the light emitting device 100 to protect the light emitting device. In addition, the molding member 240 includes a fluorescent material to change wavelengths of light emitted from the light emitting device 100.

A plurality of the light emitting device packages according to embodiments are arrayed on a substrate and also optical members such as a light guide panel, a prism sheet, a diffusion sheet, and a fluorescent sheet may be disposed on a path of light emitted from the light emitting device package. This light emitting device package, substrate, and optical member may serve as a backlight unit or a lighting unit and for example, the lighting system may include a backlight unit, a lighting unit, a pointing device, a lamp, and a streetlight.

Figure 9:
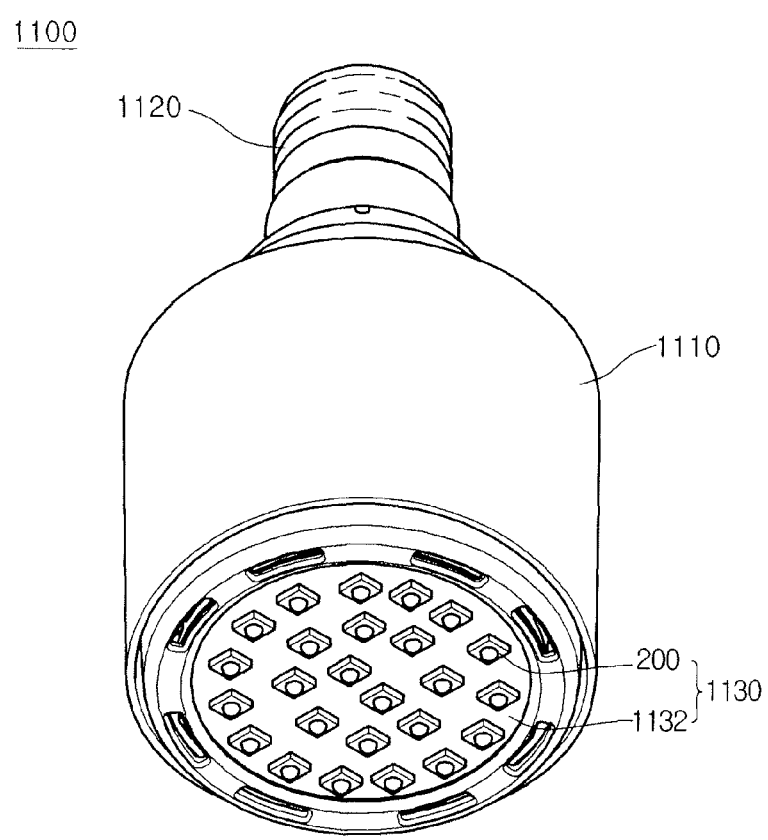
FIG. 9 is a cross-section view of a lighting unit according to an embodiment.

FIG. 9 is a perspective view of a lighting unit 1100 using the light emitting device package according to the embodiments. However, the lighting unit of FIG. 9 is just one example and is not limited thereto.

Referring to FIG. 9, the lighting unit 1100 includes a case body 1110, a light emitting module 1130 installed at the case body 1110, and a connection terminal 1110 that is installed at the case body 1110 and receives power from the external power supply.

The case body 1110 may be formed of a material having an excellent protection against heat and thus may be formed of metal material or resin material.

The light emitting module 1130 may include a substrate 1132 and a light emitting device package 200 mounted on the substrate 1132, which is formed according to at least one of the above embodiments.

The substrate 1132 may be one where a circuit pattern is printed on an insulator and may include a general printed circuit board (PCB), a metal core PCB, a flexible PCB, and a ceramic PCB.

Moreover, the substrate 1132 may be formed of a material that efficiently reflects light or may be formed with color that reflects light efficiently such as white color and silver color.

The light emitting device package 200 according to at least one of the above embodiments may be mounted on the substrate 1132. Each light emitting device package 200 may include at least one light emitting diode (LED) 100. The LED 100 may include colored LEDs for emitting colors of red, green, blue, or white and an ultraviolet (UV) LED emitting W.

The light emitting module 1130 may be arranged to have various kinds of LED combinations to obtain colors and brightness. For example, in order to obtain high color rendering index (CRI), white color LED, red color LED, and green color LED may be combined and disposed.

The connection terminal 1120 is electrically connected to the light emitting module 1130 to provide its power. As shown in FIG. 15, the connection terminal 1120 is spirally combined into the external power supply with a socket type but is not limited thereto. For example, the connection terminal 1120 is formed with a pin form and is inserted into the external power supply, or may be connected to the external power supply through wiring.

Figure 10:
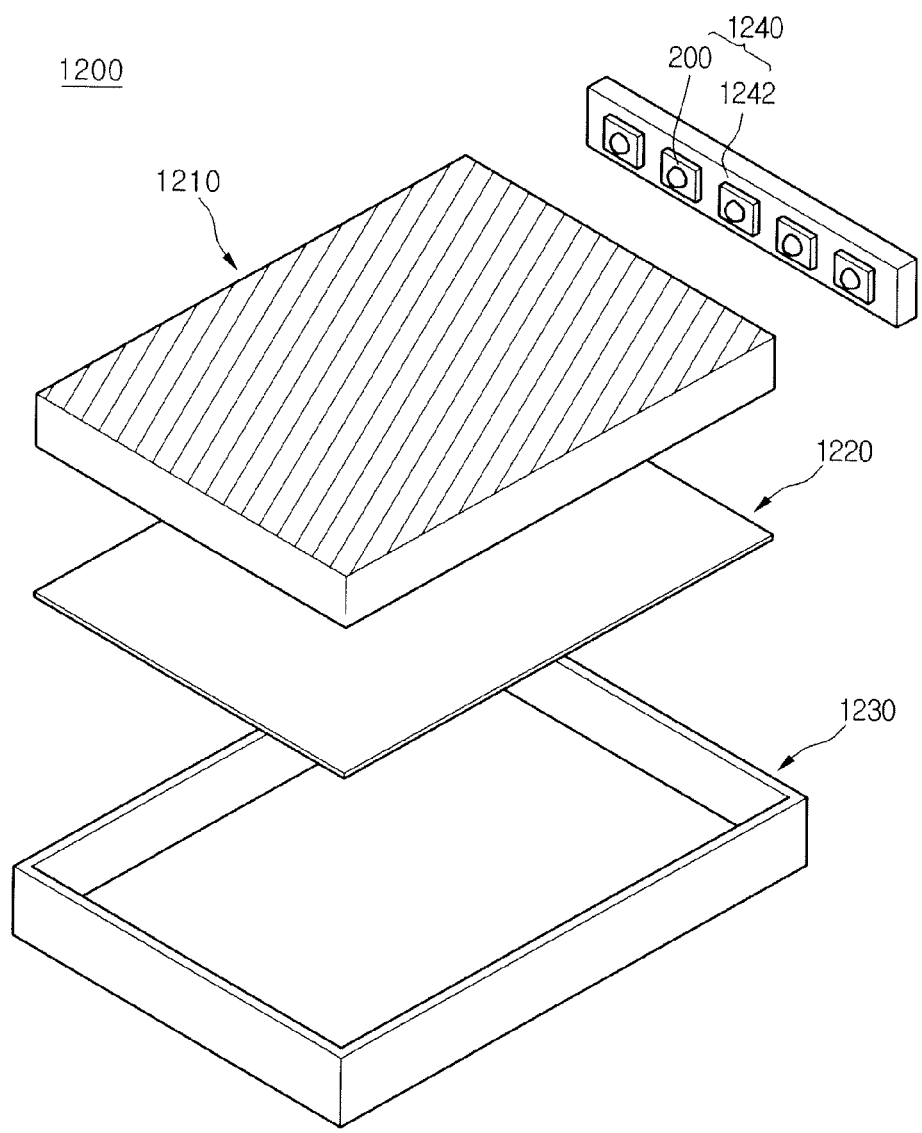
FIG. 10 is an exploded perspective view of a backlight unit according to an embodiment.

FIG. 10 is an exploded perspective view 1200 of a backlight unit according to an embodiment. However, the backlight unit 1200 of FIG. 10 is just one example of a lighting system, and thus is not limited thereto.

The backlight unit 1200 includes a light guide plate 1210, a light emitting module unit 1240 for providing light to the light guide plate 1210, a reflective member 1220 below the light guide plate 1210, and a bottom cover 1230 for receiving the light guide plate 1210, the light emitting module unit 1240, and the reflective member 1220, but is not limited thereto.

The light guide panel 1210 may serve to diffuse light to obtain a plane light. The light guide panel 1210 is formed of a transparent material, and may include at least one of acrylic resin series such as polymethyl metaacrylate (PMMA), and polyethylene terephthlate (PET), poly carbonate (PC), cycloolefin copolymer (COC), and polyethylene naphthalate (PEN) resins.

The light emitting module unit 1240 provides light to at least one side of the light guide panel 1210 and ultimately serves as a light source of a display device where the backlight unit is installed.

The light emitting module unit 1240 may contact the light guide panel 1210 but is not limited thereto. In more detail, the light emitting module unit 1240 includes a substrate 1242 and a plurality of light emitting device packages 200 mounted on the substrate 1242. The substrate 1242 may contact the light guide plate 1210 but is not limited thereto.

The substrate 1242 may be a printed circuit board (PCB) including a circuit pattern (not shown). However, the substrate 1242 may include a metal core PCB and a flexible PCB besides a typical PCB, but is not limited thereto.

Also, in relation to the plurality of light emitting device packages 200, a light emitting plane for emitting light may be mounted on the substrate 1242, being spaced apart from the light guide panel 1210.

The reflective member 1220 may be formed below the light guide panel 1210. The reflective member 1220 reflects light incident to the bottom of the light guide panel 1210 upwardly such that brightness of the backlight unit can be improved. The reflective member 1220 may be formed of PET, PC, and PVC resins, but is not limited thereto.

The bottom cover 1230 may receive the light guide panel 1210, the light emitting module unit 1240, and the reflective member 1220. For this, the bottom cover 1230 may be formed with the top having an open box form, but is not limited thereto.

The bottom cover 1230 may be formed of metal material or resin material and may be manufactured using processes such as molding or extrusion molding.

According to the light emitting device, light emitting device package, and lighting system, a plurality of light extraction patterns having respectively different periods are divided by each zone and the length of each light extraction zone may be determined by the effective propagation distance of a propagation mode. Accordingly, light extraction zones having respectively different periods diffract respectively different propagation modes such that light extraction efficiency can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure including a first conductive type semiconductor layer, a second conductive type semiconductor layer, and an active layer between the first conductive type semiconductor layer and the second conductive type semiconductor layer; and
    a light extraction structure including at least a first light extraction zone and a second light extraction zone, wherein a period and/or size of first concave and/or convex structures of the first light extraction zone is different from a period and/or size of second concave and/or convex structures of the second light extraction zone,
    wherein the first light extraction zone is separated from the second light extraction zone,
    wherein the light extraction structure comprises at least a third light extraction zone and a fourth light extraction zone, wherein at least the first light extraction zone, the second light extraction zone, the third light extraction zone, and the fourth light extraction zone are arranged in a matrix, and
    wherein the second light extraction zone has a longer period than the first light extraction zone, the third light extraction zone has a longer period than the second light extraction zone, and the fourth light extraction zone has a longer period than the third light extraction zone.

2. The light emitting device according to claim 1, comprising a line-shaped region interposed between the first light extraction zone and the second light extraction zone.

3. The light emitting device according to claim 1, wherein a length of the first light extraction zone or the second light extraction zone is between about 5 µm and about 200 µm.

4. The light emitting device according to claim 1, wherein the period of the light extraction structure in the first light extraction zone or the second light extraction zone is between about 200 nm and about 5,000 nm.

5. The light emitting device according to claim 1, wherein the period of the light extraction structure in the first light extraction zone or the second light extraction zone corresponds to a wavelength of light that the active layer generates.

6. The light emitting device according to claim 1, wherein a length of the first light extraction zone or the second light extraction zone is determined by an effective light output propagation distance of each propagation distance and absorption of the light emitting structure with respect to a wavelength of light corresponding to the period of the first light extraction zone or the second light extraction zone.

7. The light emitting device according to claim 1, wherein the first light extraction zone and the second light extraction zone are formed with a lattice structure.

8. The light emitting device according to claim 1, wherein the first light extraction zone and the second light extraction zone are arranged linearly.

9. The light emitting device according to claim 1, wherein the matrix including the first, the second, the third, and the fourth light extraction zones are repeated on the light extraction structure.

10. A light emitting device package comprising:
    a package body;
    at least one electrode layer installed at the package body; and
    the light emitting device of claim 1 connected to the electrode layer electrically.

11. A lighting system comprising:
    a substrate; and
    a light emitting module including a substrate and a light emitting device package installed on the substrate,
    wherein the light emitting device package includes:
        a package body;
        at least one electrode layer installed at the package body; and
        the light emitting device of claim 1 connected to the electrode layer electrically.

12. The emitting device according to claim 1, wherein a top most surface of the first light extraction zone has a substantially same height as a top most surface of the second light extraction zone.

13. A light emitting device comprising:
a light emitting structure including a first conductive type semiconductor layer, a second conductive type semiconductor layer, and an active layer between the first conductive type semiconductor layer and the second conductive type semiconductor layer; and
a light extraction structure including at least a first light extraction zone and a second light extraction zone, wherein a period and/or size of first protrusion and/or recess structures of the first light extraction zone is different from a period and/or size of second protrusion and/or recess structures of the second light extraction zone,
wherein the first light extraction zone is separated from the second light extraction zone,
wherein a top most surface of the first light extraction zone has a substantially same height as a top most surface of the second light extraction zone,
wherein the light extraction structure comprises at least a third light extraction zone and a fourth light extraction zone, and
wherein periods of the third light extraction zone and the fourth light extraction zone are different from the periods of the first light extraction zone and the second light extraction zone.

14. The light emitting device according to claim 13, comprising a line-shaped region interposed between the first light extraction zone and the second light extraction zone.

15. The light emitting device according to claim 13, wherein a length of the first light extraction zone or the second light extraction zone is between about 5 μm and about 200 μm.

16. The light emitting device according to claim 13, wherein the period of the light extraction structure in the first light extraction zone or the second light extraction zone is between about 200 nm and about 5,000 nm.

17. The light emitting device according to claim 13, wherein the period of the light extraction structure in the first light extraction zone or the second light extraction zone corresponds to a wavelength of light that the active layer generates.

18. The light emitting device according to claim 17, wherein a length of the first light extraction zone and the second light extraction zone is determined by an effective light output propagation distance of each propagation distance and absorption of the light emitting structure with respect to a wavelength of light corresponding to the period of the first light extraction zone or the second light extraction zones.

19. The light emitting device according to claim 13, wherein the first light extraction zone and the second light extraction zone are formed with a lattice structure.

20. The light emitting device according to claim 13, wherein the at least first light extraction zone and the second light extraction zone are arranged linearly.

21. The light emitting device according to claim 13, wherein at least the first light extraction zone, the second light extraction zone, the third light extraction zone, and the fourth light extraction zone are arranged in a matrix.

22. The light emitting device according to claim 21, wherein the matrix including the first, the second, the third, and the fourth light extraction zones are repeated on the light extraction structure.

23. A light emitting device package comprising:
a package body;
at least one electrode layer installed at the package body; and
the light emitting device of claim 13 connected to the electrode layer electrically.

24. A lighting system comprising:
a substrate; and
a light emitting module including a substrate and a light emitting device package installed on the substrate,
wherein the light emitting device package includes:
a package body;
at least one electrode layer installed at the package body; and
the light emitting device of claim 13 connected to the electrode layer electrically.

25. The light emitting device according to claim 21, wherein the second light extraction zone has a longer period than the first light extraction zone, the third light extraction zone has a longer period than the second light extraction zone, and the fourth light extraction zone has a longer period than the third light extraction zone.

26. The light emitting device according to claim 13, wherein sizes of the third light extraction zone and the fourth light extraction zone are different from sizes of the first light extraction zone and the second light extraction zone.

* * * * *